(12) United States Patent
Christenson et al.

(10) Patent No.: US 7,510,894 B2
(45) Date of Patent: Mar. 31, 2009

(54) POST-LOGIC ISOLATION OF SILICON REGIONS FOR AN INTEGRATED SENSOR

(75) Inventors: John C. Christenson, Kokomo, IN (US); Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 178 days.

(21) Appl. No.: 11/732,151

(22) Filed: Apr. 3, 2007

(65) Prior Publication Data

US 2008/0248604 A1    Oct. 9, 2008

(51) Int. Cl.
*H01L 21/00* (2006.01)
*H01L 21/461* (2006.01)
(52) U.S. Cl. .......................... 438/52; 438/48; 438/739; 257/E21.001; 257/E21.549
(58) Field of Classification Search .......... 257/E21.001, 257/E21.549
See application file for complete search history.

(56) References Cited

U.S. PATENT DOCUMENTS 7,250,322 B2 * 7/2007 Christenson et al. .......... 438/50
2008/0067621 A1 * 3/2008 Chang et al. ................. 257/444
* cited by examiner

*Primary Examiner*—Walter L Lindsay, Jr.
*Assistant Examiner*—Mohsen Ahmadi
(74) *Attorney, Agent, or Firm*—Jimmy L. Funke

(57) ABSTRACT

In producing an integrated sensor, regions of silicon between compensating electronics and a sensor are electrically isolated, while the sensor is delineating and released. The described process can be performed at the end of a fabrication process after electronics processing (i.e., CMOS processing) and compensating electronics are formed. In an aspect, the sensor and a conductive bridge are simultaneously developed from a silicon-on-insulator (SOI) substrate. In an aspect, the sensor is undercut from a silicon substrate utilizing a lateral etch. A cavity is concurrently defined by the same lateral etch in the silicon layer, forming the conductive bridge connecting the sensor to a logic component. An isolation trench is defined in the silicon layer between the sensor components and the logic component. A polymer masks vertical surfaces from the lateral etch, and an insulator layer and photosensitive film mask horizontal surfaces from the lateral etch.

26 Claims, 7 Drawing Sheets

POST-LOGIC ISOLATION OF SILICON REGIONS FOR AN INTEGRATED SENSOR

FIELD OF THE INVENTION

The invention relates generally to an integrated sensor, and more particularly to electrically isolating regions of silicon between a sensor and previously formed compensating electronics, while the sensor is simultaneously delineated and released, in a device developed from a silicon-on-insulator (SOI) substrate.

BACKGROUND OF THE INVENTION

Integrated circuit and sensor industries are focused on minimization of component dimensions. However, because of small signals produced by continuously smaller designed devices, processing of the electronic signals produced by small discrete devices has proved to be a complicated matter. Since signals from a discrete sensor must be sufficiently large and robust to be passed to its compensating electronics, which is often situated on another chip, undesirable compromises in the sensor, including larger sensing element size, larger chip sizes and lower multiples per wafer, often must be made to sufficiently increase the signal strength of the discrete sensor.

Because of the small electronic signals produced by a small discrete sensor, and the existing desire for a smaller sensor element, the discrete sensor must be situated in close proximity to the compensating electronics. This constraint currently requires that the compensating electronics chip be in the same package as the discrete sensor. For a discrete sensor to communicate with a compensator chip, the two chips must be electrically connected. This typically involves wire bonds between the chips. However, there are electrical problems with manipulating small signals, including stray capacitances due to these chip-to-chip wire bonds. Thus, contemporary packaging approaches are limited since these small signals must be protected. As an example, since the sensor element is moveable, the wire bonds may not be gelled in place in the package. This allows the wire bonds to move relative to each other, which can modulate the capacitance between the wires, thus distorting the signals between the sensor and the compensator chip. Thus, it is important to integrate the compensating electronics on the same chip as the sensor element, resulting in a need to isolate portions of an epitaxial silicon layer from each other.

Contemporary devices typically include discrete sensor chips and corresponding electrical compensating chips, usually made in a CMOS (complementary metal-on-oxide) process. Typical CMOS processes do not use isolation schemes that reach the depths typical of a silicon-on-insulator (SOI) substrate whose epitaxial layer is sufficiently thick to form a sensor element. Thus, combining a standard CMOS process with a sensor process in order to realize an integrated sensor requires an isolation scheme capable of isolating the entire thickness of the epitaxial layer. Adding such an isolation scheme to the established CMOS process requires significant modification of the CMOS process, adding risk and process complexity to the CMOS. Since it is unlikely that CMOS foundries will agree to incorporate necessary isolation steps into their standard processes, the sources of CMOS are limited.

Junction isolation is one contemporary isolation method that may be used in a CMOS process. Junction isolation is not a feasible isolation scheme for an integrated sensor because of its prohibitively excessive area, due to the isotropic nature of the dopant profile once it has been diffused completely through the epitaxial silicon layer. Typically, an all-silicon sensor element requires a relatively thick epitaxial layer, about 20-40 micrometers in one example. Thus, the lateral diffusion from the junction diffusion is also large. Further, sensor devices are sensitive to the junction capacitances that a junction isolation scheme would introduce into a device.

Trench and fill is another common contemporary isolation scheme often employed in an integrated sensor process. This scheme typically employs a high aspect ratio trench, which can be difficult to achieve. The isolation trench requires particular sidewall profiles including no re-entrant trench wall angles or bow at the top of the trench. It may also be advantageous to construct a slightly V-shaped trench, but the trench bottom must not be pinched off prior to terminating on the underlying oxide layer. Isolation trenches, once etched, typically require a liner oxide prior to the applying a trench fill material. The liner oxide is typically a thermal oxide. If the liner oxide layer is too thick, the oxidation creates damage to the silicon, causing dislocations and slip, which may extend into device areas and cause electrical leakage. Additionally, thermal cycles required to form the oxide trench liner increase the thermal budget of the CMOS process, become a process proliferation expense to the wafer fabrication facility, and add cycle time to the process The fill material for the trench requires a coefficient of thermal expansion match with silicon. Typically, polysilicon is used as a trench fill material, since it has a similar thermal expansion to silicon. However, polysilicon is conformal, and if there is a bow in the top of the trench, there will be a keyhole formed within the polysilicon near the top of the trench. Also, the thickness of the polysilicon needed to fill the trench must be at least equal to one-half the trench width, and often nearly equal to the width of the trench. This is often larger than the polysilicon thicknesses (typically 2000-3500 A) used in a typical CMOS process. A typical isolation trench width is 1.5-2 microns, which requires a polysilicon thickness for a trench fill of 1.5-4 microns of polysilicon, which is a factor of 4-10 more than a typical CMOS process polysilicon thickness. This decreases the operation availability of the polysilicon deposition tube due to both the thick polysilicon layer deposition cycle time and the increased polysilicon tube cleaning frequency.

Once the polysilicon is deposited, it must be etched back leaving the polysilicon preferentially in the trench, but removed from the top surface of the wafer allowing further processing of the CMOS. The etch back is not a trivial step, and can expose a keyhole in the center of the fill, particularly if the fill material is a conformal material, and the trench is re-entrant or has a bow in the top. Such exposed keyholes can become contamination sources. It can be difficult to remove conductive material such as successive polysilicon layers and metal layers from keyholes, possibly leading to contamination, stringers and shorts. Methods to eliminate keyholes, including making champagne glass-shaped trench tops, add process expense and complexity, and may also lead to silicon stringers and thus shorts around the isolation trench. Usually after the polysilicon is etched back, it requires passivation. Typically the polysilicon is capped with a dielectric film. This requires a deposition or a thermal oxidation step. With thermal oxidation, a vertical bird's beak may damage the silicon crystallinity at the top of the trench. Also, any capping method requires additional processing.

Trench fill material other than polysilicon may be used, all having idiosyncratic difficulties. Spin-on glasses (SOG) fail to repetitively fill trenches, and can crack, particularly when the layers are thick, and typically require thermal densification to drive off solvents and cure the film. Chemical vapor deposition (CVD) films, including low pressure CVD (LPCVD), plasma enhanced CVD (PECVD) and others (inorganics) may tend to have poor conformity, and "breadloaf" when deposited over steps, which lead to incompletely filled trenches. Further, CVD deposited films, used as a trench fill material, tend to leave a seam down the center of the trench. This may crack the conductor lines running on top of them. Highly doped glasses (LTO and TEOS) are contamination risks, cannot be accomplished early in the CMOS process, and tend not to be conformal, requiring a reflow step. CVD films other than polysilicon, such as silicon nitride, suffer from the same problems and are limited in thickness. Standard CVD recipes may also require modification to provide low stress films. Low stress films tend to demand more deposition tube maintenance than standard CVD film recipes.

Typical SOI based sensor element formation requires removal of a sacrificial oxide film to release the element. This oxide is usually removed with a wet etch, a combination wet and dry etch, or a dry etch. A wet etch suffers from stiction between the moving element and the surfaces surrounding the moving element. Combination wet and dry release methods require additional masks and process steps. Dry oxide removal processes, like vapor HF, require expensive equipment and must incorporate methods for protecting the other standard semiconductor films used on the device from the dry etchant chemical.

SUMMARY OF THE INVENTION

A process for an integrated sensor is provided that electrically isolates regions of silicon between a sensor and compensating electronics, and delineates and releases the sensor element, in a device developed from a silicon-on-insulator (SOI) substrate. The present invention process may be advantageously performed at the end of a fabrication process (i.e., CMOS processing) and after compensating electronics have been formed.

In an embodiment, the electrical isolation of silicon regions and the sensor element delineation and release are performed simultaneously, utilizing the same single mask. Therefore, a fabrication masking step is avoided as compared to contemporary integrated sensor processes, as are other complicated and costly processes including high aspect ratio etches, end pointing and metrology of high aspect ratio trenches, high temperature furnace steps, a polysilicon deposition, a polysilicon etch back step, and stiction avoidance measures during or after the sensor element release process.

The present invention release process also increases the height and thickness of the proof mass and capacitive plates and springs as compared to contemporary designs, thereby increasing the capacitance of the integrated device. Further, the integrity of the conductor materials such as polysilicon and metals are preserved over the isolation regions.

Integrated circuit wafers are used without alteration to their fabrication process. As compared with contemporary sensor processes used to make a sensor with on-board signal processing electronics, an isolation module is removed from the CMOS processing, allowing the standard CMOS processing to remain intact and unaltered. Thus, foundry CMOS wafers may be utilized to make an integrated sensor. The manufacture of the logic portion of the integrated sensor design is not limited to a CMOS foundry agreeable to incorporating an isolation step into a standard process, and thus sourcing to a low cost vendor or foundry is made available.

Features of the invention are achieved in part, in an embodiment, by employing a single mask and simultaneous etching steps to the device isolation region and the sensor element region. The integrity of conductor materials such as polysilicon and metals are preserved over the isolation regions. In an embodiment, the sensor is delineated utilizing a trench etch, and then undercut from a silicon substrate utilizing a lateral etch. A masking agent is used to mask a vertical surface of the sensor from the lateral etch, and an insulator layer and photosensitive film mask a horizontal surface of the sensor from the lateral etch. A deep reactive ion etch (DRIE) may be employed for both the trench etch and the lateral etch. In another embodiment, utilizing a trench etch and footer undercut, the sensor (silicon layer) is delineated and released from the silicon substrate and also released from the insulator layer originally situated between the silicon layer and the silicon substrate.

In an embodiment, a cavity is defined in the silicon layer forming a conductive bridge, the conductive bridge connecting the sensor to a logic component having conducting components. The lateral etch etches the cavity into the silicon substrate and the silicon layer under the conductive bridge. A photosensitive film masks portions of the conductive, insulating and silicon surfaces, and a masking agent masks a vertical surface of a first portion of the silicon layer joined with the sensor adjacent to the conductive bridge from the lateral etch. The insulator layer masks a horizontal surface of the first portion of the silicon layer joined with the sensor adjacent to the conductive bridge from the lateral etch. In addition, an isolation trench is defined in the silicon layer between the sensor and the logic component, and between portions of the sensor. The trench and lateral etches also separate the first portion of the silicon layer joined with the sensor and a second portion of the silicon layer joined with the logic component.

Useful variations of the processes described are further provided, as may be desired for various applications. For example, when forming either the sensor or the conductive bridge, or both simultaneously, a lower insulator layer may be etched prior to depositing the masking agent that masks the silicon layer from a lateral etch. In a further embodiment, the electrical isolation of silicon regions and the sensor element delineation and release are masked separately, and performed at the end of a fabrication process (i.e., CMOS processing) and after compensating electronics have been formed.

Other features and advantages of this invention will be apparent to a person of skill in the art who studies the invention disclosure. Therefore, the scope of the invention will be better understood by reference to an example of an embodiment, given with respect to the following figures.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE INVENTION

Figure 1:
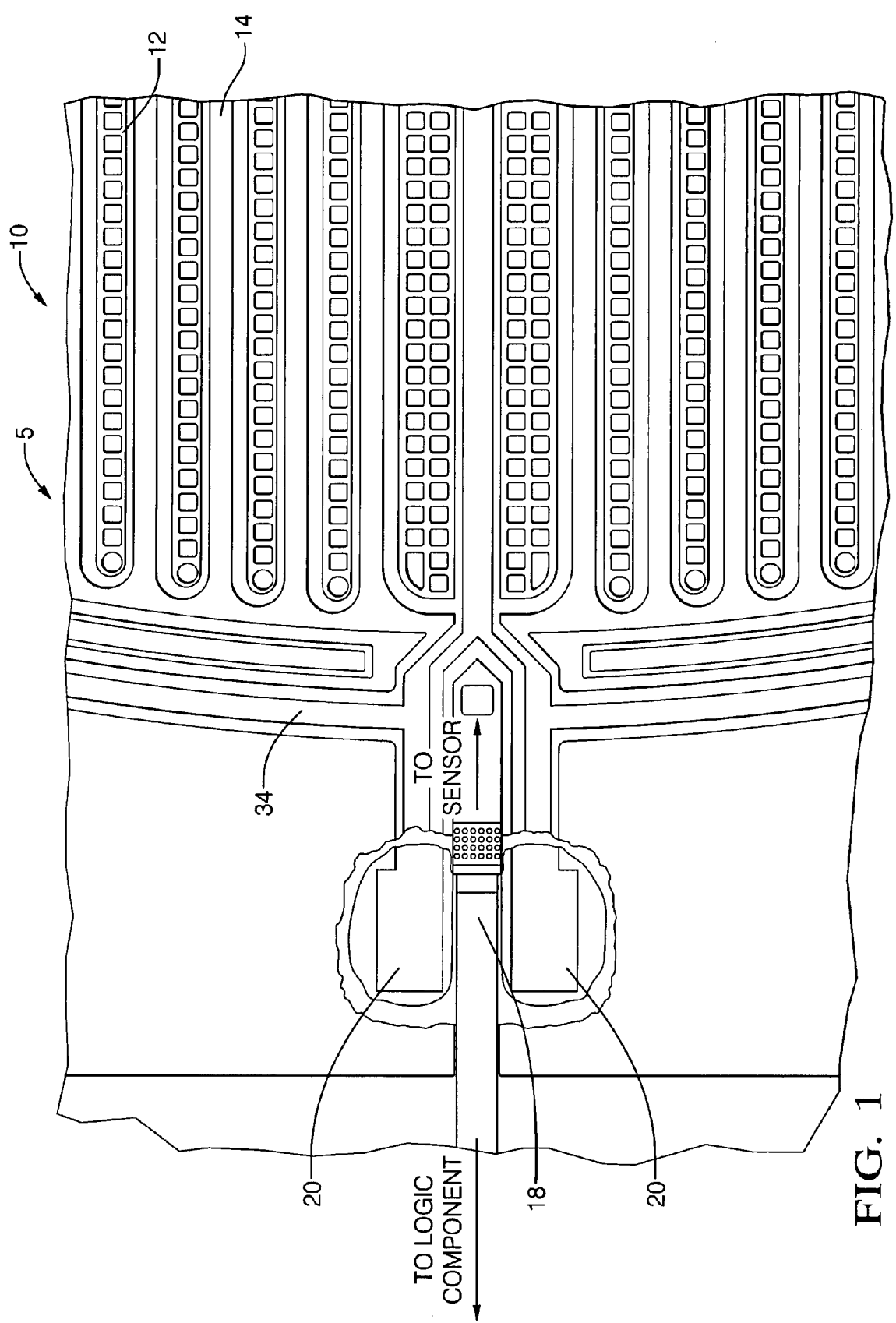
FIG. 1 is a top plan view of an integrated sensor having a sensor element connected to a logic component by way of a conductive bridge, also illustrating a cavity formed below the conductive bridge that electrically isolates regions of silicon, in accordance with an embodiment of the present invention.

Exemplary embodiments are described with reference to specific configurations. Those of ordinary skill in the art will appreciate that various changes and modifications can be made while remaining within the scope of the appended claims. Additionally, well-known elements, devices, components, methods, process steps and the like may not be set forth in detail in order to avoid obscuring the invention. Further, unless indicated to the contrary, any numerical values set forth in the following specification and claims are approximations that may vary depending upon the desired characteristics sought to be obtained by the present invention.

A process is described herein for an integrated sensor that electrically isolates regions of silicon between a sensor and compensating electronics, and delineates and releases the sensor element, in a device developed from a silicon-on-insulator (SOI) substrate. The present invention process may be advantageously performed at the end of a fabrication process (i.e., CMOS processing) and after compensating electronics have been formed. In an embodiment, the electrical isolation of silicon regions and the sensor element delineation and release are performed simultaneously, utilizing the same single photolithographic mask, during the same single photolithographic masking step. The masking material of the single photolithographic masking step may include metal, an insulator, an upper insulator layer, a metal passivation layer, a polymer, and a photosensitive layer, as discussed below. A fabrication masking step is therefore avoided as compared to other contemporary integrated sensor processes, as are other complicated and costly processes including high aspect ratio etches, end pointing and metrology of high aspect ratio trenches, high temperature furnace steps, a polysilicon deposition, a polysilicon etch back step, and stiction avoidance measures during or after the sensor element release process.

The present invention release process also allows for increases to the height and thickness of the proof mass and capacitive plates and springs as compared to contemporary designs, thereby increasing the capacitance of the integrated device. Further, the integrity of the conductor materials such as polysilicon and metals are preserved over the isolation regions.

Advances in technology have led to DRIE machines that can perform both silicon etches and insulator etches. DRIE etches commonly use alternating polymer deposition and etch steps during the course of an etch process. Thus, the steps described herein with regard to the following figures of anisotropic silicon etching (trench etching), isotropic silicon etching (lateral silicon etching), polymer deposition, selective removal of polymer from only exposed horizontal surfaces of a substrate (leaving polymer on vertical surfaces and other protected surfaces), and insulator etching may be performed in a single machine, or in two or more machines. Further, these described processes can be performed separately or may be advantageously grouped together during a run in a machine.

Integrated circuit wafers are used without alteration to their fabrication process. As compared with contemporary sensor processes used to make an integrated sensor with on-board signal processing electronics, an isolation module is removed from the CMOS processing, allowing the standard CMOS processing to remain intact and unaltered. Thus, foundry CMOS wafers may be utilized to make an integrated sensor device. The manufacture of the logic portion of the integrated sensor design is not limited to a CMOS foundry agreeable to incorporating an isolation step into a standard process, and thus sourcing to a low cost vendor or foundry is made available. Additionally, it is to be appreciated that the present invention may be utilized with other appropriate compensating electronics fabrication processes, besides a CMOS process, and allow the other electronics processing to remain intact and unaltered as well.

Referring to the drawings wherein identical reference numerals denote the same elements throughout the various views, FIG. 1 illustrates an integrated sensor 5 having a sensor element 10 connected with a logic component by way of conductive bridge connection 18. The conductive bridge 18 electrically connects the logic component (not shown) with the sensor element 10. A cavity 20 formed below the conductive bridge 18, and isolation trenches 34 formed adjacent to the conductive bridge 18, electrically isolate regions of silicon with the logic component from the regions of silicon with the sensor element 10. The sensor element 10 includes interdigitated members and springs (described infra). The interdigitated members include a moveable member 12 and a fixed member 14. The production of the sensor element 10 and conductive bridge 18 are described in detail infra.

Figure 2:
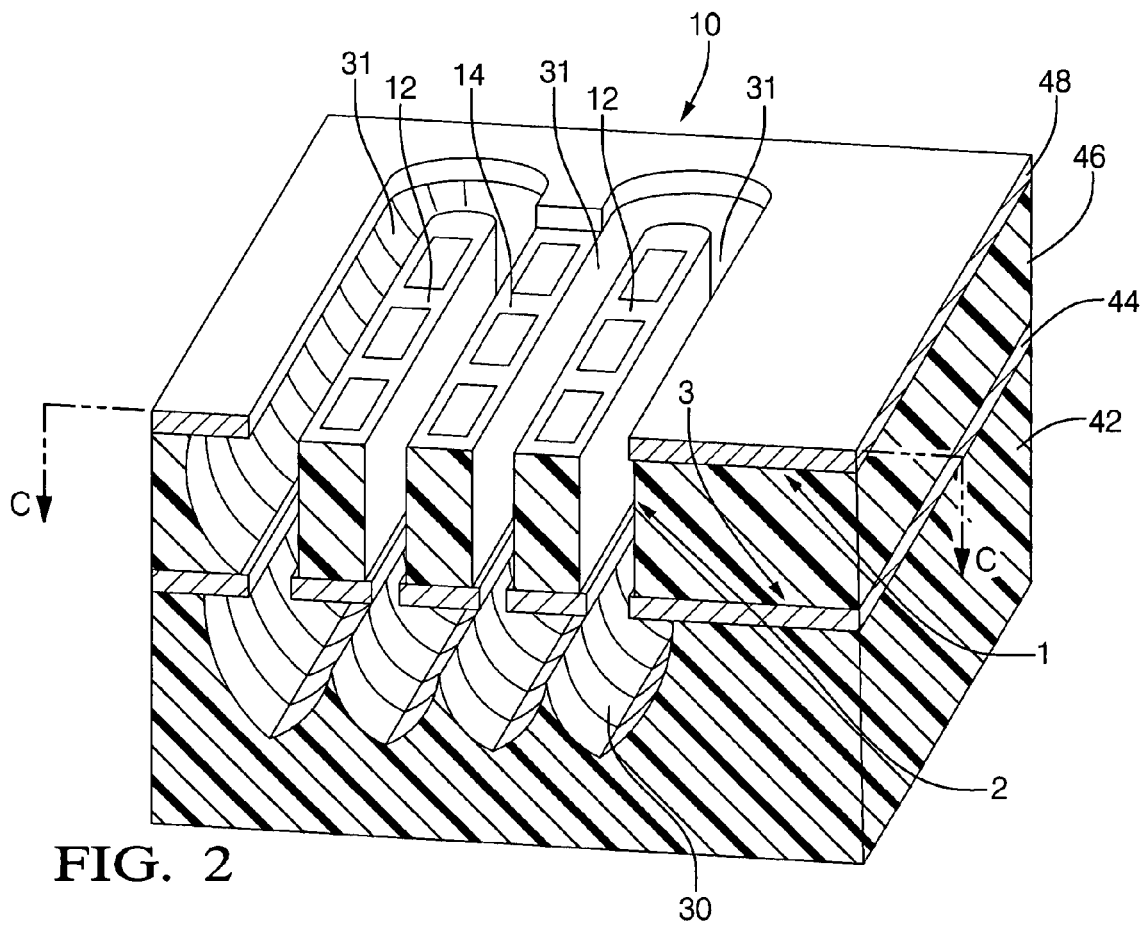
FIG. 2 is a perspective sectional view of a portion of a sensor undercut from a silicon-on-insulator substrate having a moveable structure and a fixed structure, in accordance with an embodiment of the present invention.

FIG. 2 is a perspective sectional view of a portion of a sensor element 10 undercut from a silicon substrate 42 having a moveable member 12 and a fixed member 14, in accordance with an embodiment of the present invention. The sensor element 10 is shaped from a silicon-on-insulator (SOI) substrate, wherein silicon layer 46 is situated over lower insulator layer 44.

The etched cavity 30 and etched gaps 31 electrically isolate regions of silicon, namely silicon layer 46, moveable member 12 and fixed member 14. It is to be observed that the etched gap 31 is etched into the left illustrated side of silicon layer 46 while the right illustrated side of silicon layer 46 was masked from a lateral etch. The formation of the gap 31 into the left illustrated side silicon layer 46 is further discussed below in FIG. 4F.

The sensor element 10 is delineated utilizing a trench etch, and released utilizing a lateral etch to undercut the sensor from the silicon substrate 42. The lower insulator layer 44 of the sensor element 10 is undercut from silicon substrate 42 utilizing a lateral etch. A masking agent is used to mask vertical surface 2 of the silicon layer 46 from the lateral etch. An upper horizontal surface 1 of the silicon layer 46 is masked from the lateral etch utilizing upper insulating layer 48 and a photosensitive film (shown infra), while a lower horizontal surface 3 of the silicon layer 46 is masked from the lateral etch utilizing the lower insulator layer 44. In an embodiment, the fabrication process of delineating and releasing the sensor is performed after fabrication of compensating electronics for the sensor, the compensating electronics may be CMOS technology.

In an embodiment, the sensor element 10 may be formed having a moveable member 12, a fixed member 14, and a spring. An asymmetric gap between the moveable member 12 and the fixed member 14 establishes a capacitive gap and a parasitic gap. The capacitance changes as a function of the gap distance, and thus the moveable member 12 and the fixed member 14 measure magnitude of a force and direction of a force that is applied to the sensor element 10. As an example, when the sensor is moved by an external force, the smaller capacitive gap may become smaller thereby increasing the capacitance, while the larger parasitic gap becomes larger thereby decreasing the capacitance. Therefore, the magnitude of the capacitance changes equally on both sides of the moveable member 12. Additionally, direction of the force can be measured since the capacitance changes in opposite directions. The displacement of the moveable member 12 is small enough to accommodate the existing capacitive gap and parasitic gap.

It is to be appreciated that many other sensor element types besides interdigitated members can be fabricated using embodiments of the present invention including cantilevers, mass-and-spring systems, proof masses, rings, capacitor plates, perforations, sensors with symmetric or asymmetric gaps, and laterally and vertically displaced sensor elements. Further, other types of signals can be generated through embodiments of the present invention besides capacitive signals as in sensor element 10, such as piezoresistive, biosensors, pressure sensors, etc.

Figure 3:
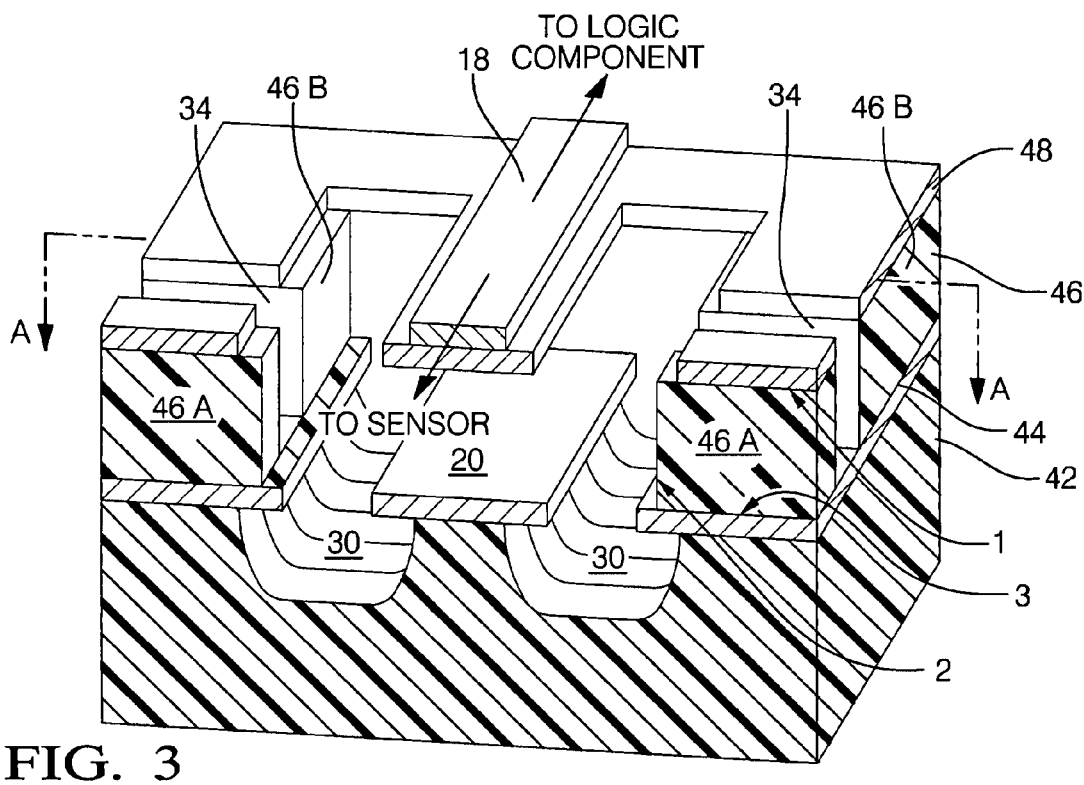
FIG. 3 is a perspective sectional view of the conductive bridge connection between a logic component and a sensor, illustrating an etched cavity and an isolation trench, which electrically isolates regions of silicon, in accordance with an embodiment of the present invention.

Referring to FIG. 3, a perspective sectional view is shown of a conductive bridge connection 18 between a logic component and a sensor element, in accordance with an embodiment of the present invention. An upper etched cavity 20, a lower etched cavity 30 and an isolation trench 34 electrically isolate regions of silicon. The conductive bridge 18 connects one region of silicon electrically connected to a logic component, to a separated region of silicon electrically connected to a sensor element. The conductive bridge 18 electrically connects the sensor element to the logic component. The upper etched cavity 20 is defined within silicon layer 46, and vertically between upper insulator layer 48 and lower insulator layer 44. Isolation trench 34 is defined in the silicon substrate 46 separating the silicon layer 46A joined with the sensor element and the silicon layer 46B joined with the logic component. The lower etched cavity 30 is defined within the silicon substrate 42.

A lateral etch defines upper etched cavity 20 in the silicon layer 46 under the conductive bridge 18, and lower etched cavity 30 in the silicon substrate 42. A masking agent such as a polymer is utilized to mask a vertical surface 2 of silicon layer 46 adjacent to the conductive bridge 18 from the lateral etch. The lower insulator layer 44 is utilized to mask a horizontal surface 3 of the silicon layer 46 adjacent to the conductive bridge 18 from the lateral etch. A photosensitive film (not shown) and the upper insulating layer 48 are utilized to mask a horizontal surface 1 of the silicon layer 46 from the lateral etch.

FIG. 4A-4H are cross-sectional side views of fabrication steps in forming a sensor element undercut from a silicon substrate as in FIG. 2 along section C-C, in accordance with an embodiment of the present invention. The sensor element shown in the following figures can be formed simultaneously with the conductive bridge of FIG. 5A-5H.

Figure 4A:
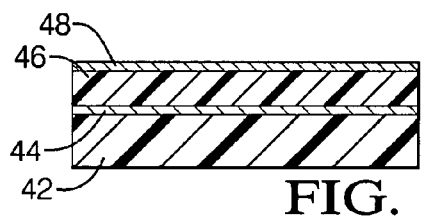
FIG. 4A-4H are cross-sectional side views of fabrication steps in forming a sensor undercut from a silicon substrate as in FIG. 2 along section C-C, in accordance with an embodiment of the present invention.

As illustrated in FIG. 4A, a lower insulator layer 44 is situated over a silicon substrate 42, a silicon layer 46 is situated over lower insulator layer 44, and an upper insulator layer 48 is situated over silicon layer 46.

Figure 4B:
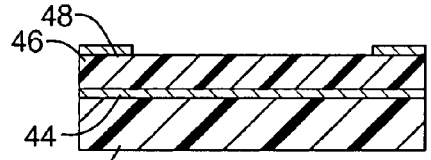

As illustrated in FIG. 4B, a portion of upper insulator layer 48 is masked and etched to establish an open window to the silicon layer 46. The masking layer is then removed.

Figure 4C:
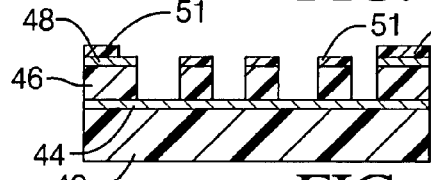

As illustrated in FIG. 4C, a photosensitive film 51 is applied over the upper insulator layer 48 and silicon layer 46. It is then patterned, and trench etching is utilized to etch a trench into silicon layer 46.

Figure 4D:
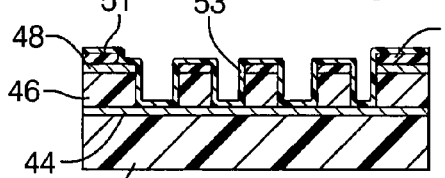

As illustrated in FIG. 4D, a masking agent 53, such as a polymer, is conformally applied over the photosensitive film 51, the upper insulator layer 48, the silicon layer 46, and the lower insulator layer 44. It is to be appreciated that films and materials including insulator films, metal passivation films, and metals may be used to mask certain etches, including DRIE etches, in addition to photosensitive films and polymers.

Figure 4E:
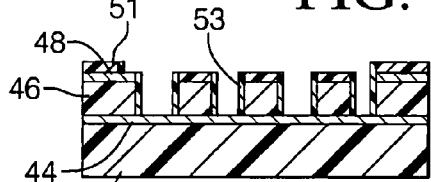

As illustrated in FIG. 4E, the masking agent 53 is removed from a horizontal surface of the photosensitive film 51, the upper insulator layer 48, and the lower insulator layer 44.

Figure 4F:
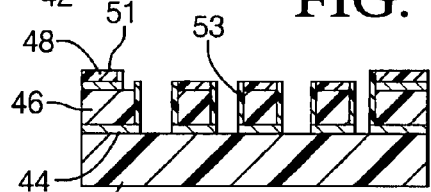

As illustrated in FIG. 4F, the lower insulator layer 44 is etched at the bottom of the trench to expose the silicon substrate 42. Additionally, a portion of the upper insulator layer 48 (left side shown) is etched.

Figure 4G:
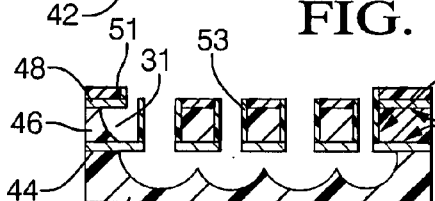

As illustrated in FIG. 4G, the sensor element is released utilizing a lateral etch to undercut the silicon layer 46 and the lower insulator layer 44 from the silicon substrate 42, wherein the masking agent 53 is used to mask a vertical surface 2 of the silicon layer 46 from the lateral etch, and the lower insulator layer 44 and a photosensitive film 51 are utilized to mask a horizontal surface 3 of the silicon layer 46 from the lateral etch. The upper insulator layer 48 and the photosensitive film 51 are utilized to mask a horizontal surface 1 of silicon layer 46 from the lateral etch.

Figure 4H:
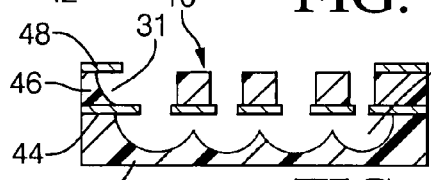

As illustrated in FIG. 4H, the photosensitive film 51 and the masking agent 53 are removed from the upper insulator layer 48, the silicon layer 46, and the lower insulator film 44.

The steps shown in FIGS. 4C, 4D 4E, 4F and 4G may be performed as individual processes or combinations of processes. Further, the steps shown in FIGS. 4C, 4D, 4E, 4F and 4G may be performed during the same etch run in the same equipment.

As illustrated in FIG. 5A-5H, cross-sectional side views are shown along section A-A of in FIG. 3 of fabrication steps in defining upper etched cavity 20 and lower etched cavity 30, and forming a conductive bridge 18 that connects a logic component and a sensor element, in accordance with an embodiment of the present invention. The conductive bridge shown in the following figures can be formed simultaneously with the sensor element of FIG. 4A-4H.

Figure 5A:
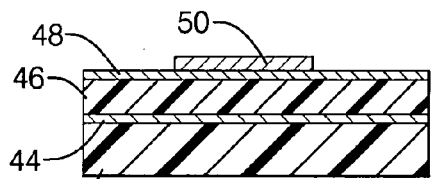
FIG. 5A-5H are cross-sectional side views of fabrication steps in defining a cavity and forming a conductive bridge as in FIG. 3 along section A-A, wherein the conductive bridge is formed simultaneously with the sensor of FIG. 4A-4H, the conductive bridge connecting a logic component and a sensor, in accordance with an embodiment of the present invention.

As illustrated in FIG. 5A, a lower insulator layer 44 is situated over a silicon substrate 42, a silicon layer 46 is situated over lower insulator layer 44, an upper insulator layer 48 is situated over silicon layer 46, and a conductive layer 50 is situated over a portion of upper insulator layer 48.

Figure 5B:
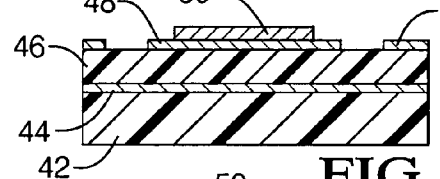

As illustrated in FIG. 5B, a photosensitive film is applied over conductive layer 50 and upper insulator layer 48, and patterned. An open window is then etched through a portion of the upper insulator layer 48 to expose the silicon layer 46. The photosensitive film is then removed.

Figure 5C:
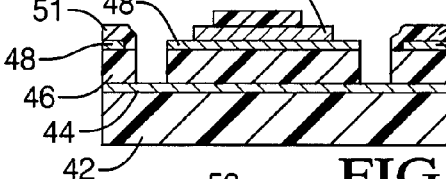

As illustrated in FIG. 5C, a photosensitive film 51 is applied and patterned, and trench etching is utilized to etch a trench into silicon layer 46.

Figure 5D:
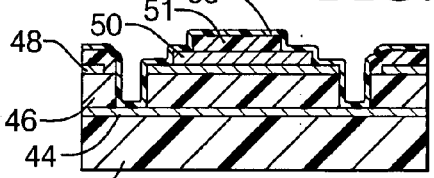

As illustrated in FIG. 5D, a masking agent 53 such as a polymer is conformally applied over the photosensitive film 51, the conductive layer 50, the upper insulator layer 48, the silicon layer 46, and the lower insulator layer 44.

Figure 5E:
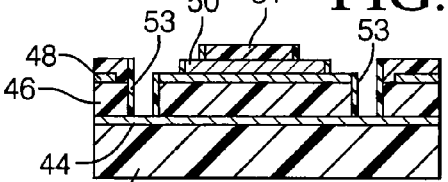

As illustrated in FIG. 5E, the masking agent 53 is removed from a horizontal surface of the photosensitive film 51, the conductive layer 50, the upper insulator layer 48, the silicon layer 46, and the lower insulator layer 44.

Figure 5F:
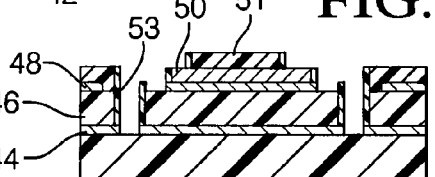

As illustrated in FIG. 5F, the lower insulator layer 44 at the bottom of the trench is etched with any appropriate etch method as is known in the art, to expose the silicon substrate 42 situated below the lower insulator layer 44. The upper insulator layer 48 adjacent to the conductive layer 50 is also etched, exposing the silicon layer 46 adjacent to the conductive layer 50.

Figure 5G:
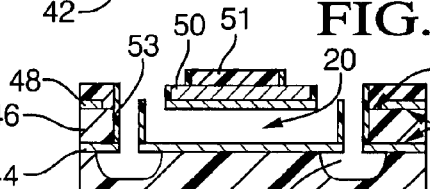

As illustrated in FIG. 5G, a lateral etch (including, i.e., a plasma etch, DRIE etch or sulfur hexafluoride (SF6) etch) is utilized to etch upper cavity 20 defined within silicon layer 46. The lateral etch is also utilized to etch lower cavity 30 defined within the silicon substrate 42. The masking agent 53 is utilized to mask a vertical surface 2 of silicon layer 46 from the lateral etch. The lower insulator layer 44 is utilized to mask a horizontal surface 3 from the lateral etch. The upper insulating layer 48, and photosensitive film 51 are utilized to mask a horizontal surface 1 from the lateral etch.

Figure 5H:
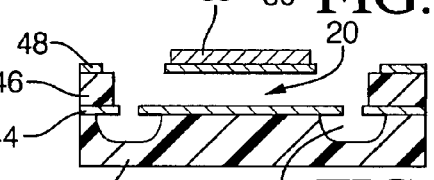

As illustrated in FIG. 5H, the masking agent 53 and the photosensitive film 51 are removed from the conductive layer 50, the upper insulator layer 48, and the silicon layer 46.

Additionally, the steps shown in FIGS. 5C, 5D 5E, 5F and 5G may be performed as individual processes or combinations of processes. Further, the steps shown in FIGS. 5C, 5D, 5E, 5F and 5G may be performed during the same etch run in the same equipment.

FIG. 6A-6E are cross-sectional side views of alternative fabrication steps in forming a sensor element undercut from a silicon substrate as in FIG. 2 along section C-C, in accordance with another embodiment of the present invention. The sensor element shown in the following figures can be formed simultaneously with the conductive bridge of FIG. 7A-7E.

To arrive at the structure shown in FIG. 6A, the same steps described in FIGS. 4A-4C supra are employed. Additionally, the lower insulator layer 44 at the bottom of the trench is etched to expose the silicon substrate 42, and a portion of the upper insulator 48 is etched to expose portions of silicon layer 46.

Next, as illustrated in FIG. 6B, the masking agent 53 is conformally applied over the photosensitive film 51, the upper insulator layer 48, the silicon layer 46, the lower insulator layer 44, and the silicon substrate 42.

As illustrated in FIG. 6C, the masking agent 53 is removed from a horizontal surface of the photosensitive film 51, the silicon layer 46, and the silicon substrate 42.

As illustrated in FIG. 6D, the sensor element is released utilizing a lateral etch to undercut the silicon layer 46 and the lower insulator layer 44 from the silicon substrate 42, wherein photosensitive film 51 and the upper insulator layer 48 are used to mask a horizontal surface 1 of the silicon layer 46 from the lateral etch, the masking agent 53 is used to mask a vertical surface 2 of the silicon layer 46 from the lateral etch, and the lower insulator layer 44 is utilized to mask a horizontal surface 3 of the silicon layer 46 from the lateral etch.

As illustrated in FIG. 6E, the masking agent 53 and the photosensitive film 51 are removed from the upper insulator layer 48, the silicon layer 46, and the lower insulator film 44.

The steps shown in FIGS. 6A, 6B, 6C, 6D, and 6E may be performed as individual processes or combinations of processes. Further, the steps shown in FIGS. 6A, 6B, 6C, 6D and 6E may be performed during the same etch run in the same equipment.

Figure 6:
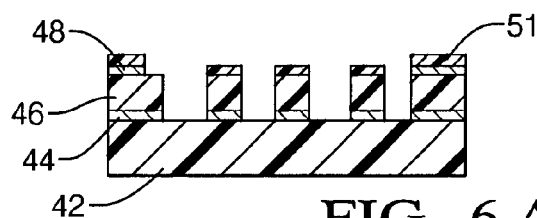
FIG. 6A-6E are cross-sectional side views of alternative fabrication steps in forming a sensor undercut from a silicon substrate as in FIG. 2 along section C-C, in accordance with another embodiment of the present invention.

In the processes described in FIG. 4 and FIG. 6, the sensor fingers are not eroded, and thus remain full height, and as such are less variable. These process sequences also allow the drawn width (printed at the photolithography step) of the sensor element features, such as finger widths, spring widths, etc., to be conserved, even as other areas of the sensor or isolation regions are being etched.

FIG. 7A-7E are cross-sectional side views of alternative fabrication steps in defining upper etched cavity 20 and lower etched cavity 30 and forming a conductive bridge as in FIG. 3 along section A-A, the conductive bridge connecting a logic component and a sensor element, in accordance with another embodiment of the present invention. The conductive bridge shown in the following figures can be formed simultaneously with the sensor element of FIG. 6A-6E.

Figure 7:
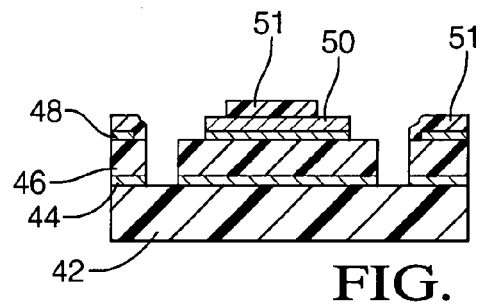
FIG. 7A-7E are cross-sectional side views of alternative fabrication steps in defining a cavity and forming a conductive bridge as in FIG. 3 along section A-A, wherein the conductive bridge is formed simultaneously with the sensor of FIG. 6A-6E, in accordance with another embodiment of the present invention.
Figure 6:
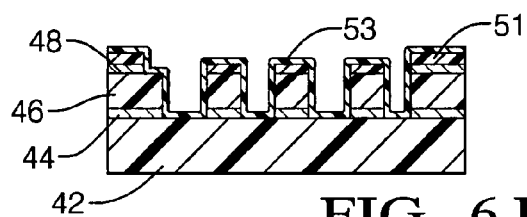
Figure 7:
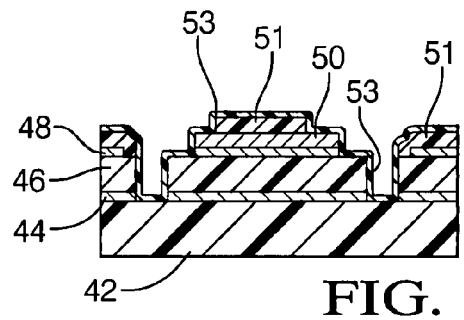
Figure 6:
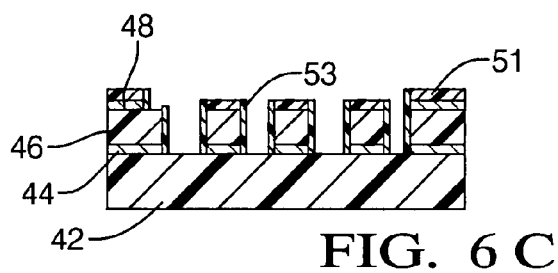
Figure 7:
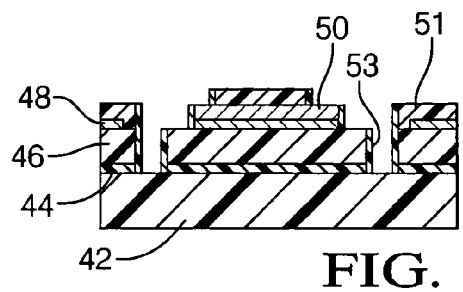
Figure 6:
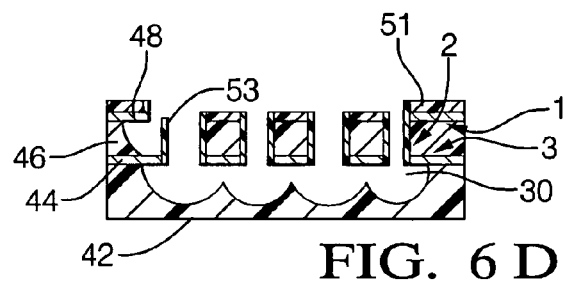
Figure 7:
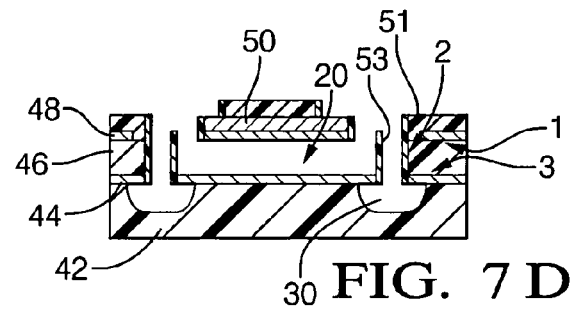
Figure 6:
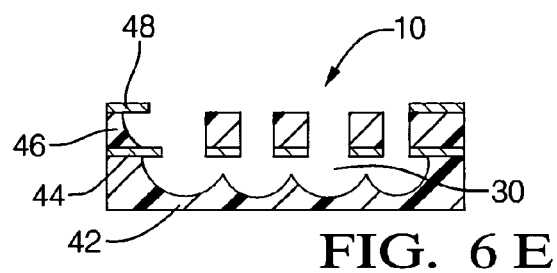
Figure 7:
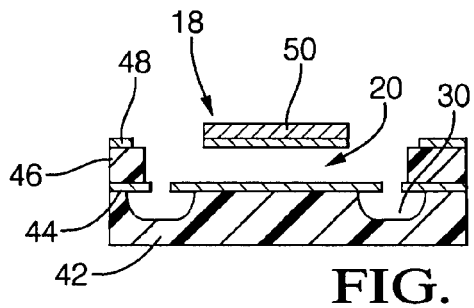

To arrive at the structure shown in FIG. 7A, the same steps described in FIGS. 5A-5C supra are employed. Additionally, the lower insulator layer 44 at the bottom of the trench is etched to expose the silicon substrate 42. Also, a portion of the upper insulator layer 48 adjacent to the conductive layer 50 is etched, exposing the silicon layer 46 adjacent to the conductive layer 50.

Next, as illustrated in FIG. 7B, a masking agent 53 such as a polymer is conformally applied over the photosensitive film 51, the conductive layer 50, the upper insulator layer 48, the silicon layer 46, the lower insulator layer 44, and the exposed silicon substrate 42.

As illustrated in FIG. 7C, the masking agent 53 is removed from a horizontal surface of the photosensitive film 51, the conductive layer 50, the silicon layer 46, and the exposed silicon substrate 42.

As illustrated in FIG. 7D, a lateral etch is utilized to etch cavity 20 defined within silicon layer 46. The lateral etch is also utilized to etch cavity 30 defined within the silicon substrate 42. The photosensitive film 51 and upper insulator layer 48 is utilized to mask a horizontal surface 1 from the lateral etch. The masking agent 53 is utilized to mask a vertical surface 2 of silicon layer 46 from the lateral etch. The lower insulator layer 44 is utilized to mask a horizontal surface 3 from the lateral etch.

As illustrated in FIG. 7E, the masking agent 53 and the photosensitive film 51 are removed from the conductive layer 50, the upper insulator layer 48, and the silicon layer 46.

The steps shown in FIGS. 7A, 7B, 7C, 7D, and 7E may be performed as individual processes or combinations of processes. Further, the steps shown in FIGS. 7A, 7B, 7C, 7D, and 7E may be performed during the same etch run in the same equipment.

FIG. 8A-8H are cross-sectional side views of fabrication steps in forming a sensor element with a footer undercut, wherein the sensor element is alternatively undercut from a silicon substrate and from an insulator, in accordance with an embodiment of the present invention. The sensor element shown in the following figures can be formed simultaneously with the conductive bridge of FIG. 9A-9H.

The footer undercut erodes a sensor member height, thus reducing the capacitance per surface area for any given starting silicon layer thickness. Additionally, the footer undercut causes the sensor member height to be more variable as compared to the members described in FIG. 4 and FIG. 6.

Figure 8:
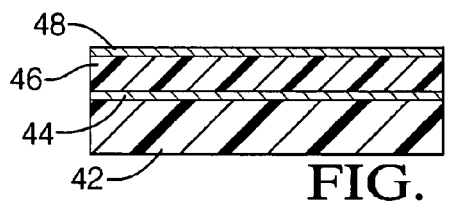
FIG. 8A-8H are cross-sectional side views of fabrication steps in forming a sensor with a footer undercut, wherein the sensor is alternatively undercut from a silicon substrate and an insulator, in accordance with an embodiment of the present invention.
Figure 8:
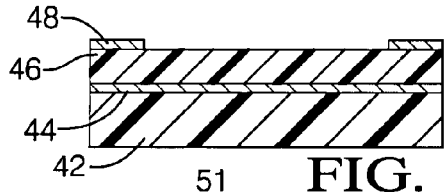
Figure 8:
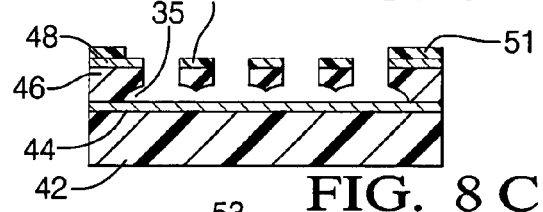
Figure 8:
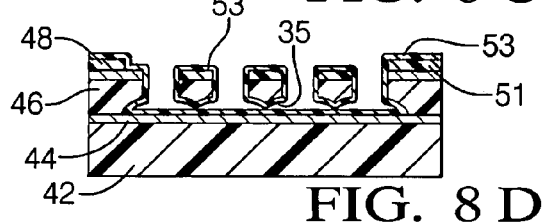
Figure 8:
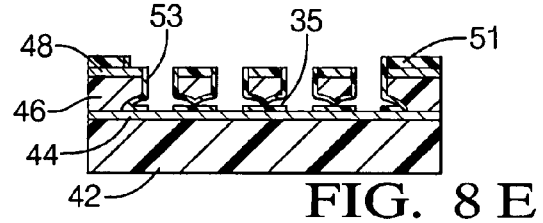
Figure 8:
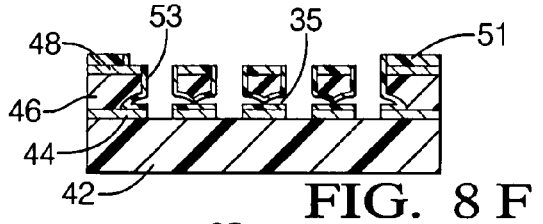
Figure 8:
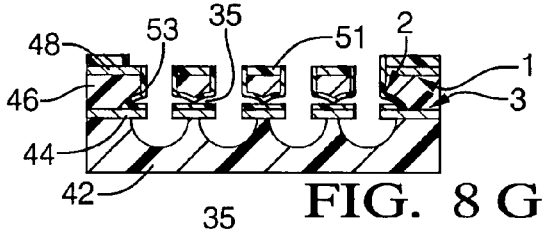
Figure 8:
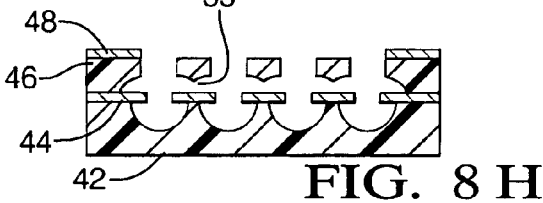

As illustrated in FIG. 8A, a lower insulator layer 44 is situated over a silicon substrate 42, a silicon layer 46 is situated over lower insulator layer 44, and an upper insulator layer 48 is situated over silicon layer 46.

As illustrated in FIG. 8B, a portion of upper insulator layer 48 is masked and etched to establish an open window to the silicon layer 46. The masking layer is then removed.

As illustrated in FIG. 8C, a photosensitive film 51 is applied and patterned, and trench etching is utilized to etch a trench into the silicon layer 46. The trench etching first delineates the sensor element, and then a footer undercut etch process produces a footer undercut 35 which releases the silicon layer 46 from the lower insulator layer 44 and from the silicon substrate 42.

As illustrated in FIG. 8D, a masking agent 53, such as a polymer, is conformally applied over the photosensitive film 51, the upper insulator layer 48, the silicon layer 46, and the lower insulator layer 44.

As illustrated in FIG. 8E, the masking agent 53 is removed from a horizontal surface of the photosensitive film 51, and a portion of the lower insulator layer 44 that is not masked by an above-situated silicon layer 46.

As illustrated in FIG. 8F, the lower insulator layer 44 is etched at the bottom of the trench to expose the silicon substrate 42. However, the lower insulator layer 44 that is masked by the masking agent 53 remains contacting the silicon substrate 42 and is not etched.

As illustrated in FIG. 8G, a lateral etch is employed undercutting the silicon substrate 42. The photosensitive film 51 and the upper insulator layer 48 are utilized to mask a horizontal surface 1 of the silicon layer 46 from the lateral etch. The masking agent 53 is used to mask a vertical surface 2 of the silicon layer 46, and the regions of silicon layer 46 exposed by the footer undercut 35, from the lateral etch. The lower insulator layer 44 and the masking agent 53 are utilized to mask a horizontal surface 3 of the silicon layer 46 from the lateral etch.

As illustrated in FIG. 8H, the masking agent 53 and photosensitive film 51 are removed from the upper insulator layer 48, the silicon layer 46, and the lower insulator film 44.

The steps shown in FIGS. 8C, 8D, 8E, 8F, and 8G may be performed as individual processes or combinations of processes. Further, the steps shown in FIGS. 8C, 8D, 8E, 8F, and 8G may be performed during the same etch run in the same equipment.

FIG. 9A-9H are cross-sectional side views of fabrication steps in forming a conductive bridge connection between a logic component and a sensor element, with a further defined cavity having a footer undercut, in accordance with an embodiment of the present invention. The conductive bridge can be formed simultaneously with the sensor element of FIG. 8A-8H.

Figure 9:
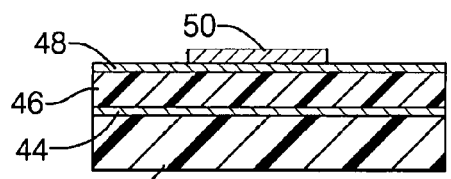
FIG. 9A-9H are cross-sectional side views of fabrication steps in forming a conductive bridge with a footer undercut, and wherein the conductive bridge is formed simultaneously with the sensor of FIG. 8A-8H, in accordance with an embodiment of the present invention.
Figure 9:
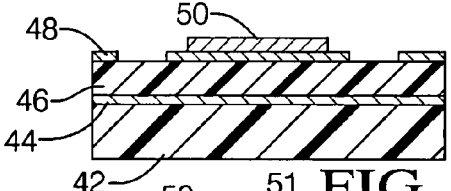
Figure 9:
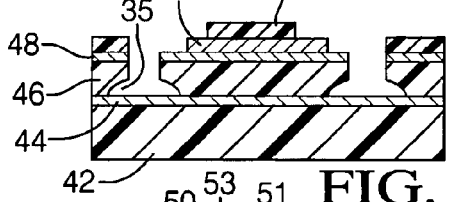
Figure 9:
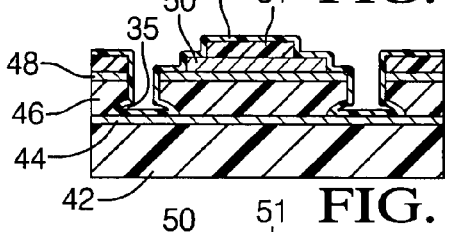
Figure 9:
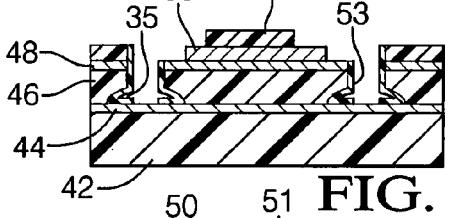
Figure 9:
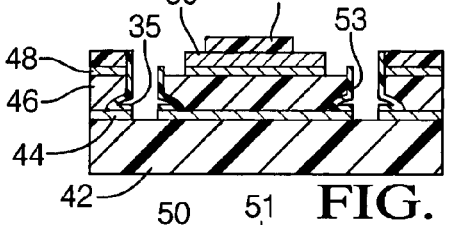
Figure 9:
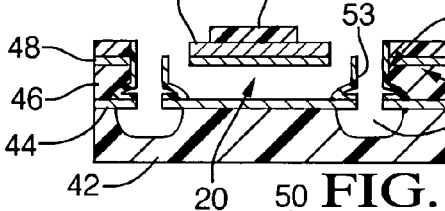
Figure 9:
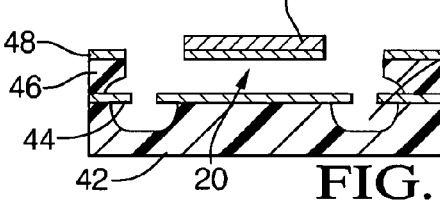

As illustrated in FIG. 9A, a lower insulator layer 44 is situated over a silicon substrate 42, a silicon layer 46 is situated over lower insulator layer 44, an upper insulator layer 48 is situated over silicon layer 46, and a conductive layer 50 is situated over a portion of upper insulator layer 48.

As illustrated in FIG. 9B, a photosensitive film is applied over conductive layer 50 and upper insulator layer 48, and patterned. An open window is then etched through a portion of the upper insulator layer 48 to expose the silicon layer 46, and then the photosensitive film is removed.

As illustrated in FIG. 9C, photosensitive film 51 is applied and patterned, trench etching is utilized to etch a trench into the silicon layer 46, and then a footer undercut process is used to etch the footer undercut 35 into the silicon layer 46.

As illustrated in FIG. 9D, a masking agent 53 such as a polymer is conformally applied over the photosensitive film 51, the conductive layer 50, the upper insulator layer 48, the silicon layer 46, and the lower insulator layer 44.

As illustrated in FIG. 9E, the masking agent 53 is removed from a horizontal surface of the photosensitive film 51, the conductive layer 50, the upper insulator layer 48, and the portion of the lower insulator layer 44 that is unshielded by the silicon layer 46.

As illustrated in FIG. 9F, the lower insulator layer 44 at the bottom of the trench is etched to expose the silicon substrate 42. The upper insulator layer 48 adjacent to the conductive layer 50 is also etched, exposing the silicon layer 46 adjacent to the conductive layer 50.

As illustrated in FIG. 9G, a lateral etch is utilized to etch upper cavity 20 defined within silicon layer 46. The lateral etch is also utilized to etch lower cavity 30 defined within the silicon substrate 42. The photosensitive film 51 and the upper insulator layer 48 mask the horizontal surface 1 of silicon layer 46 from the lateral etch. The masking agent 53 is utilized to mask a vertical surface 2 of silicon layer 46, and the regions of silicon layer 46 exposed by the footer undercut 35, from the lateral etch. The lower insulator layer 44 is utilized to mask a horizontal surface 3 of silicon layer 46 from the lateral etch.

As illustrated in FIG. 9H, the masking agent 53 and photosensitive film 51 are removed from the conductive layer 50, the upper insulator layer 48, the silicon layer 46, and the lower insulator 44.

The steps shown in FIGS. 9C, 9D, 9E, 9F and 9G may be performed as individual processes or combinations of processes. Further, the steps shown in FIGS. 9C, 9D, 9E, 9F and 9G may be performed during the same etch run in the same equipment.

FIG. 10A-10G are cross-sectional side views of alternative fabrication steps in forming a sensor element, having a footer undercut, wherein the sensor element is alternatively undercut from a silicon substrate and from an insulator, in accordance with an embodiment of the present invention. The sensor element shown in the following figures can be formed simultaneously with the conductive bridge of FIG. 11A-11G.

Figure 10:
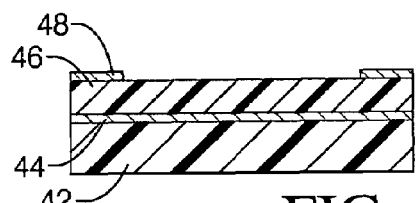
FIG. 10A-10G are cross-sectional side views of alternative fabrication steps in forming a sensor with a footer undercut, wherein the sensor is alternatively undercut from a silicon substrate and from an insulator, in accordance with an embodiment of the present invention.
Figure 10:
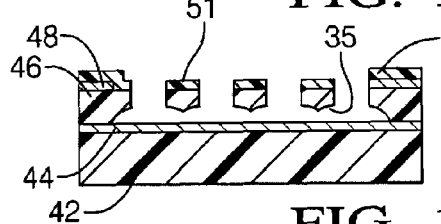
Figure 10:
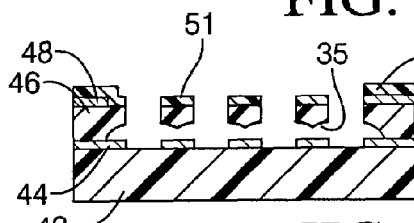
Figure 10:
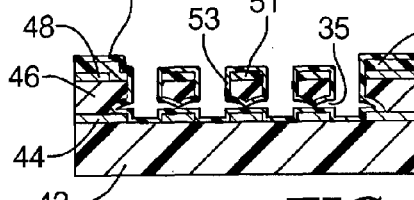
Figure 10:
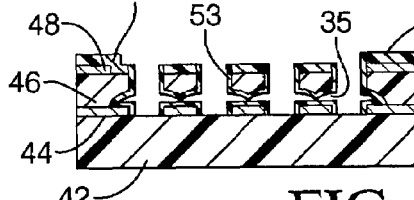
Figure 10:
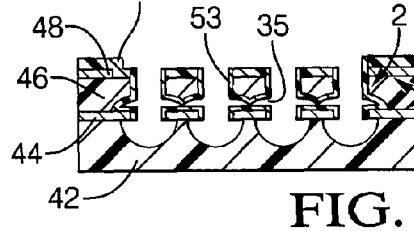
Figure 10:
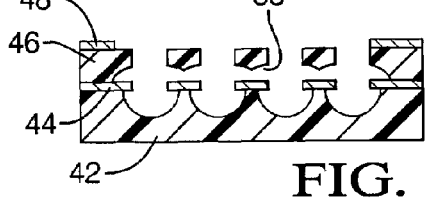

As illustrated in FIG. 10A, a lower insulator layer 44 is situated over a silicon substrate 42, a silicon layer 46 is situated over lower insulator layer 44, and an upper insulator layer 48 is situated over silicon layer 46. A photosensitive film is applied over insulator layer 48 and is patterned. A portion of upper insulator layer 48 is removed to establish an open window to the silicon layer 46. The photosensitive film is then removed.

As illustrated in FIG. 10B, a photosensitive film 51 is applied and patterned, and trench etching is then utilized to etch a trench into the silicon layer 46. The trench etching first delineates the sensor element, and then a footer undercut process is utilized to produce a footer undercut 35, which releases the silicon layer 46 from the lower insulator layer 44 and from the silicon substrate 42.

As illustrated in FIG. 10C, the lower insulator layer 44 is etched at the bottom of the trench to expose the silicon substrate 42. However, the lower insulator layer 44 that is shielded by the silicon layer 46 remains contacting the silicon substrate 42 and is not etched.

As illustrated in FIG. 10D, a masking agent 53, such as a polymer, is conformally applied over the photosensitive film 51, the upper insulator layer 48, the silicon layer 46, the lower insulator layer 44, and the silicon substrate 42.

As illustrated in FIG. 10E, the masking agent 53 is removed from a horizontal surface of the photosensitive film 51, and the silicon substrate 42.

As illustrated in FIG. 10F, a lateral etch is employed to undercut the silicon substrate 42. The photosensitive film 51 and the upper insulator layer 48 are utilized to mask a horizontal surface 1 of the silicon layer 46 from the lateral etch. The masking agent 53 is used to mask a vertical surface 2 of the silicon layer 46, and the regions of silicon layer 46 exposed by the footer undercut 35, from the lateral etch. The lower insulator layer 44 and the masking agent 53 are utilized to mask a horizontal surface 3 of the silicon layer 46 from the lateral etch.

As illustrated in FIG. 10G, the masking agent 53 and photosensitive film 51 are removed from the upper insulator layer 48, the silicon layer 46, and the lower insulator film 44.

The steps shown in FIGS. 10B, 10C, 10D, 10E, and 10F may be performed as individual processes or combinations of processes. Further, the steps shown in FIGS. 10B, 10C, 10D, 10E, and 10F may be performed during the same etch run in the same equipment.

FIG. 11A-11G are cross-sectional side views of alternative fabrication steps in forming a conductive bridge connection between a logic component and a sensor element, with a further defined cavity having a footer undercut, in accordance with an embodiment of the present invention. The conductive bridge can be formed simultaneously with the sensor element of FIG. 10A-10G, in accordance with an embodiment of the present invention.

Figure 11:
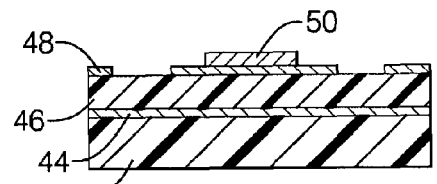
FIG. 11A-11G are cross-sectional side views of alternative fabrication steps in forming a conductive bridge connection between a logic component and a sensor, wherein the conductive bridge is formed simultaneously with the sensor of FIG. 10A-10G, in accordance with an embodiment of the present invention.
Figure 11:
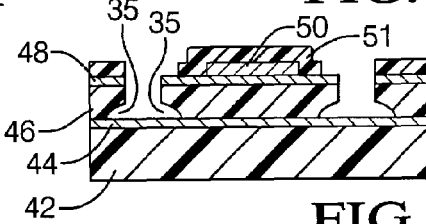
Figure 11:
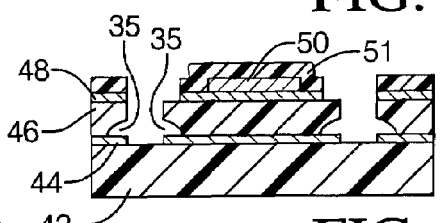
Figure 11:
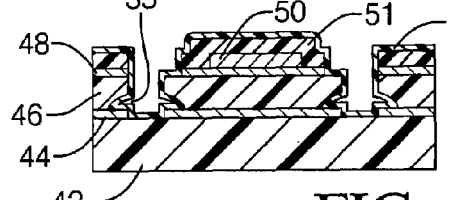
Figure 11:
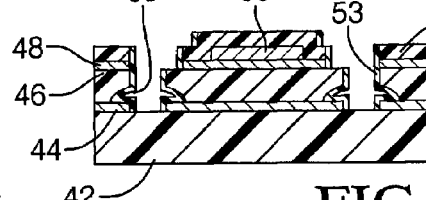
Figure 11:
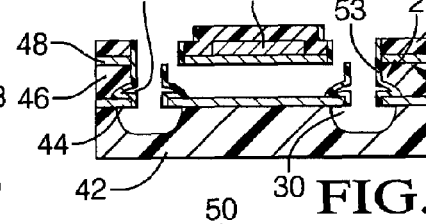
Figure 11:
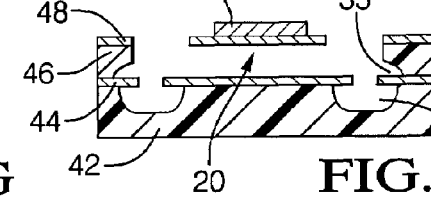

As illustrated in FIG. 11A, a photosensitive film is applied over conductive layer 50 and upper insulator layer 48, and patterned. An open window is then etched through a portion of the upper insulator layer 48 to expose the silicon layer 46. The photosensitive film is then removed.

As illustrated in FIG. 11B, a photosensitive film 51 is applied and patterned and trench etching is utilized to etch a trench into the silicon layer 46. A footer undercut etch process is then utilized to etch a footer undercut 35 into the silicon layer 46.

As illustrated in FIG. 11C, the lower insulator layer 44 at the bottom of the trench is etched to expose the silicon substrate 42. The upper insulator layer 48 adjacent to the conductive layer 50 is also etched, exposing the silicon layer 46 adjacent to the conductive layer 50.

As illustrated in FIG. 11D, a masking agent 53 such as a polymer is conformally applied over the photosensitive film 51, the conductive layer 50, the upper insulator layer 48, the silicon layer 46, the lower insulator layer 44, and the silicon substrate 42.

As illustrated in FIG. 11E, the masking agent 53 is removed from a horizontal surface of the photosensitive film 51, silicon layer 46, and the silicon substrate 42.

As illustrated in FIG. 11F, a lateral etch is utilized to etch upper cavity 20 defined within silicon layer 46. The lateral etch is also utilized to etch lower cavity 30 defined within the silicon substrate 42. The photosensitive film 51 and the upper insulator layer 48 mask the horizontal surface 1 of silicon layer 46 from the lateral etch. The masking agent 53 is utilized to mask a vertical surface 2 of silicon layer 46, and the regions of silicon layer 46 exposed by the footer undercut 35, from the lateral etch. The lower insulator layer 44 is utilized to mask a horizontal surface 3 of silicon layer 46 from the lateral etch.

As illustrated in FIG. 11G, the masking agent 53 and photosensitive film 51 are removed from the conductive layer 50, the upper insulator layer 48, the silicon layer 46, and the lower insulator 44.

The steps shown in FIGS. 11B, 11C, 11D, 11E, and 11F may be performed as individual processes or combinations of processes. Further, the steps shown in FIGS. 11B, 11C, 11D, 11E, and 11F may be performed during the same etch run in the same equipment.

FIG. 12A-12G are cross-sectional side views of fabrication steps in forming a conductive bridge and a sensor element, wherein the conductive bridge and the sensor element are formed in separate (not concurrent) fabrication steps, in accordance with an embodiment of the present invention.

Here, an additional mask is utilized to isotropically undercut the bridge in a separate processing step. While this process requires an additional mask and etch process to undercut the conductive bridge prior to delineating and releasing the sensor element, the number of etching process steps may be reduced from other above-described methods.

Also, while the conductive bridge and the sensor element are formed separately, rather than simultaneously, the present invention process may still be performed at the end of a fabrication process after electronics processing and compensating electronics have been formed, without alteration to the electronics processing and compensating electronics fabrication process.

Figure 12:
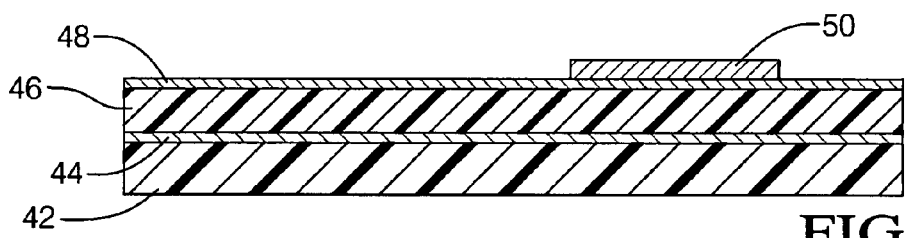
FIG. 12A-12G are cross-sectional side views of fabrication steps in forming a conductive bridge and a sensor, wherein the conductive bridge and the sensor element are formed in separate (not concurrent) fabrication steps, in accordance with an embodiment of the present invention.
Figure 12:
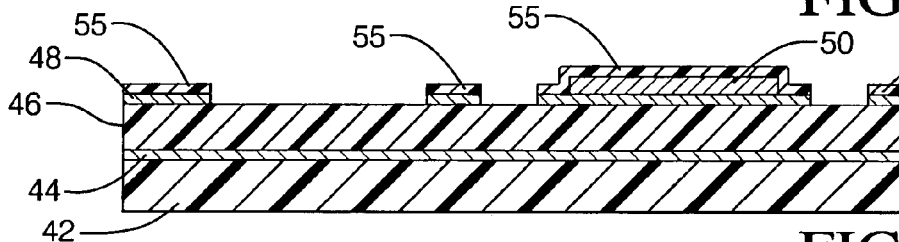
Figure 12:
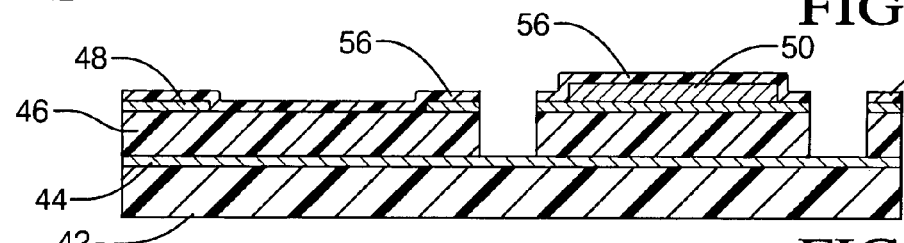
Figure 12:
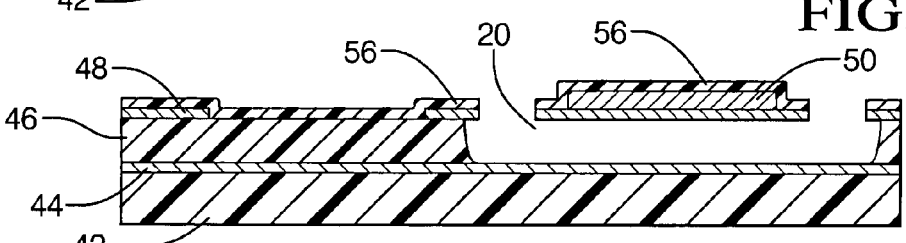
Figure 12:
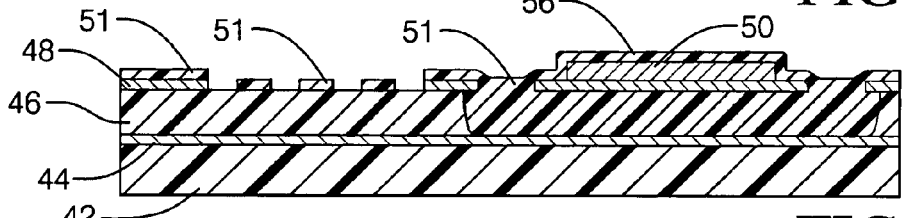
Figure 12:
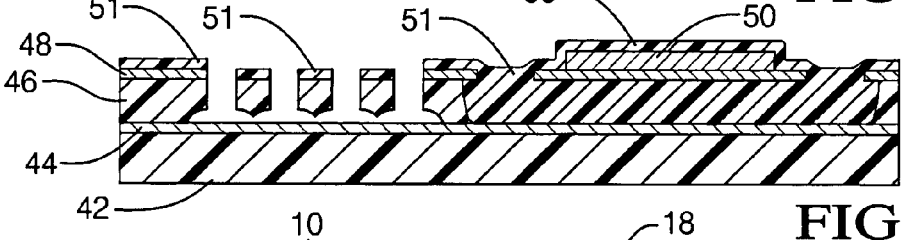
Figure 12:
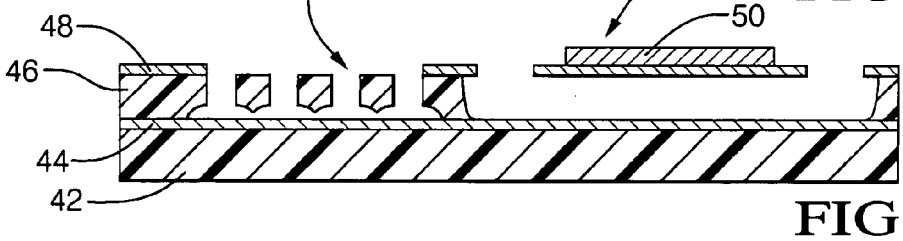

As illustrated in FIG. 12A, a lower insulator layer 44 is situated over a silicon substrate 42, a silicon layer 46 is situated over lower insulator layer 44, an upper insulator layer 48 is situated over silicon layer 46. Additionally, on the conductive bridge portion of the integrated sensor (right side of the figure), a conductive layer 50 is situated over a portion of upper insulator layer 48.

As illustrated in FIG. 12B, FIG. 12C, and FIG. 12D, the conductive bridge is formed prior to forming the sensor element of the integrated sensor.

As illustrated in FIG. 12B, a photosensitive film 55 is applied over conductive layer 50 and upper insulator layer 48, and patterned. An open window is then etched through a portion of the upper insulator layer 48 to expose the silicon layer 46. The photosensitive film 55 is then removed.

As illustrated in FIG. 12C, a photosensitive film 56 is applied over conductive layer 50, upper insulator 48, and the sensor portions of silicon layer 46, leaving the portions of silicon layer 46 adjacent to the conductive bridge exposed, and trench etching is utilized to etch a trench into silicon layer 46 adjacent to the conductive bridge.

As illustrated in FIG. 12D, a lateral etch is utilized to undercut the conductive bridge from silicon layer 46, and to etch upper cavity 20 defined within silicon layer 46. The photosensitive film is then removed.

In FIG. 12E, FIG. 12F and FIG. 12G, the sensor element 10 is formed subsequent to forming the conductive bridge of the integrated sensor.

As illustrated in FIG. 12E, photosensitive film 51 is applied over conductive layer 50, upper insulator 48, and silicon layer 46, filling upper cavity 20, and is then patterned.

As illustrated in FIG. 12F, a trench etch is utilized to etch trenches through silicon layer 46, thus delineating the sensor element. A footer undercut process is then employed to undercut portions of silicon layer 46, thus releasing the sensor element formed within silicon layer 46 from the lower insulator layer 44.

As illustrated in FIG. 12G, the photosensitive film layer 51 is removed from the completed integrated sensor.

Other features and advantages of this invention will be apparent to a person of skill in the art who studies this disclosure. Thus, exemplary embodiments, modifications and variations may be made to the disclosed embodiments while remaining within the spirit and scope of the invention as defined by the appended claims.

We claim:

1. A method of isolating regions of silicon in producing an integrated sensor comprising:
   delineating a sensor from a silicon-on-insulator (SOI) substrate utilizing a trench etch, wherein the SOI substrate comprises a silicon layer situated over a first insulator layer, wherein the first insulator layer is situated over a silicon substrate; and
   releasing the sensor utilizing a lateral etch to undercut the sensor from the silicon substrate, wherein a masking agent is used to mask a vertical surface of the silicon layer from the lateral etch, wherein the first insulator layer and a photosensitive film are utilized to mask a horizontal surface of the silicon layer from the lateral etch, and wherein the isolating is performed after fabrication of compensating electronics for the integrated sensor,
   wherein delineating the sensor comprises:
   etching an open window through a portion of a second insulator layer, exposing the silicon layer;
   etching a trench into the silicon layer; and
   etching a portion of the first insulator layer, exposing the silicon substrate situated below the first insulator layer.

2. The method as in claim 1, further comprising, subsequent to etching the first insulator layer:
   conformally applying the masking agent over the photosensitive film, the second insulator layer, the silicon layer, the first insulator layer, and the silicon substrate; and
   removing the masking agent from a horizontal surface of the photosensitive film, the silicon layer, and the silicon substrate.

3. The method as in claim 1, farther comprising, prior to etching the first insulator layer:
   conformally applying the masking agent over the photosensitive film, the second insulator layer, the silicon layer, and the first insulator layer; and
   removing the masking agent from a horizontal surface of the photosensitive film, the silicon layer, the second insulator layer and the first insulator layer.

4. The method as in claim 1, further comprising removing the masking agent and the photosensitive film from the second insulator layer, the silicon layer, and the first insulator layer.

5. The method as in claim 1, wherein the trench etch, the lateral etch, a masking agent deposition. a selective removal of the masking agent, and the first insulator etching are performed as individual processes or combinations of processes, and are performed during the same etch run in the same equipment, the equipment comprising a deep reactive ion etch (DRIE) machine.

6. The method as in claim 1, wherein delineating and releasing the sensor includes forming interdigitated members, cantilevers, mass-and-spring systems, proof masses, rings, capacitor plates, perforations, sensors with symmetric and asymmetric gaps. and laterally and vertically displaced sensor elements.

7. The method as in claim 1, further comprising, with the delineating and releasing the sensor, simultaneously electrically isolating the sensor by defining a cavity forming a conductive bridge, the conductive bridge connecting the sensor to a logic component, and defining an isolation trench between the sensor and the logic component,
   wherein defining the cavity forming the conductive bridge comprises utilizing the lateral etch to etch the silicon substrate and the silicon layer under the conductive bridge, wherein the masking agent masks a vertical surface of a first portion of the silicon layer joined with the sensor from the lateral etch, and the first insulator layer masks a horizontal surface of the first portion of the silicon layer joined with the sensor from the lateral etch, and
   wherein defining the isolation trench comprises separating the first portion of the silicon layer joined with the sensor and a second portion of the silicon layer joined with the logic component.

8. The method as in claim 7, further comprising utilizing a single photolithographic mask, during a single photolithographic masking step, for the sensor delineation, the sensor release, and the electrical isolation.

9. The method as in claim 8, wherein the compensating electronics comprise CMOS technology.

10. A method of isolating regions of silicon in producing an integrated sensor comprising:
    shaping a conductive bridge from a silicon-on-insulator (SOI) substrate, utilizing a trench etch, wherein a silicon layer is situated over a first insulator layer, and the first insulator layer is situated over a silicon substrate; and
    defining a cavity under the conductive bridge, the conductive bridge connecting a sensor to a logic component, and defining an isolation trench between the sensor and the logic component,
    wherein defining the cavity comprises utilizing a lateral etch to etch the silicon substrate and the silicon layer under the conductive bridge, wherein a masking agent masks a vertical surface of a First portion of the silicon layer joined with the sensor from. the lateral etch, and the first insulator layer and a photosensitive film mask a horizontal surface of the first portion of the silicon layer joined with the sensor from the lateral etch,
    wherein defining the isolation trench comprises separating the first portion of the silicon layer joined with the sensor and a second portion of the silicon layer joined with the logic component, and
    wherein the isolating is performed after fabrication of compensating electronics for the integrated sensor.

11. The method as in claim 10, wherein the shaping the conductive bridge comprises:
    etching an open window through a portion of a second insulator layer, exposing the silicon layer;
    etching a trench into the silicon layer; and etching a portion of the first insulator layer, exposing the silicon substrate situated below the first insulator layer.

12. The method as in claim 11, further comprising, subsequent to etching into the first insulator layer:
conformally applying the masking agent over the photosensitive film, the second insulator layer, the silicon layer, the first insulator layer. and the silicon substrate; and
removing the masking agent front a horizontal surface of the photosensitive film, the silicon layer, and the silicon substrate.

13. The method as in claim 11, further comprising, prior to etching into the first insulator layer:
conformally applying the masking agent over the photosensitive film, the second insulator layer, the silicon layer, and the first insulator layer; and
removing the masking agent from. a horizontal surface of the photosensitive film, the silicon layer, the second insulator layer and the first insulator layer.

14. The method as in claim 11, wherein the trench etch, the lateral etch, a masking agent deposition, a selective removal of the masking agent, and the first insulator etching are performed as individual processes or combinations of processes, and are performed during the same etch run in the same equipment, the equipment comprising a deep reactive ion etch (DRIE) machine.

15. The method as in claim 10, further comprising removing the masking agent and the photosensitive film from the conductive layer, the second insulator layer, the silicon layer, -and the first insulator layer.

16. The method as in claim 10, further comprising, with the shaping the conductive bridge and defining the cavity and the isolation trench, simultaneously delineating die sensor and then releasing the sensor utilizing the lateral etch to undercut the sensor from the silicon substrate, wherein the masking agent is used to mask a vertical surface of the silicon layer from the lateral etch, and the first insulator layer and the photosensitive film are utilized to mask a horizontal surface of the silicon layer from the lateral etch.

17. The method as in claim 16, further comprising utilizing a single photolithographic mask, during a single photolithographic masking step, for the shaping the conductive bridge, the defining the cavity, the defining the isolation trench, the sensor delineation, and the sensor release.

18. The method as in claim 17, wherein the compensating electronics comprise CMOS technology.

19. A method of isolating regions of silicon inproducing an integrated sensor comprising:
delineating a sensor from a silicon-on-insulator (SO1) substrate utilizing atrench etch, wherein a silicon layer is situated over a first insulator layer, and thefirst insulator layer is situated over a silicon substrate;
releasing the sensor utilizing a footer undercut etch to undercut the siliconlayer from the first insulator layer; and
lateral etching the silicon substrate, wherein a masking agent is used tomask the silicon layer from the lateral etch, and a photosensitive film is utilized tomask a horizontal surface of the silicon layer from the lateral etch, wherein thefirst insulator layer is etched prior to lateral etching the silicon substrate toexpose the silicon substrate to the lateral etching, and wherein the isolating isperformed after fabrication of compensating electronics for the integrated sensor,
wherein delineating the sensor comprises:
etching an open window through a portion of a second insulator layer,exposing the silicon layer; and
etching a portion of the first insulator layer, exposing the silicon substratesituated below the first insulator layer.

20. The method as in claim 19, further comprising, subsequent to etching into the first insulator layer:
conformally applying the masking agent over the photosensitive film, the second insulator layer, the silicon layer, the first insulator layer, and the silicon substrate; and
removing the masking agent from a horizontal surface of the photosensitive film, the silicon layer, and the silicon substrate.

21. The method as in claim 19, further comprising, prior to etching into the first insulator layer:
conformally applying the masking agent over the photosensitive film, the second insulator layer, the silicon layer, and the first insulator layer; and
removing the masking agent from a horizontal surface of the photosensitive film, the silicon layer, the second insulator layer and the first insulator layer.

22. The method as in claim 19, wherein the trench etch, the footer undercut etch, a masking agent deposition, a selective removal of the masking agent, and the first insulator etching are performed as individual processes or combinations of processes, and are performed during the same etch run in the same equipment, the equipment comprising a deep reactive ion etch (DRIE) machine.

23. The method as in claim 20, wherein delineating and releasing the sensor includes forming interdigitated members, cantilevers, mass-and-spring systems, proof masses, rings, capacitor plates, perforations, sensors with symmetric and asymmetric gaps, and laterally and vertically displaced sensor elements.

24. The method as in claim 19, further comprising, with the delineating and releasing the sensor, simultaneously electrically isolating the sensor by defining a cavity forming a conductive bridge, the conductive bridge connecting the sensor to a logic component, and defining an isolation trench between the sensor and the logic component,
wherein defining the cavity forming the conductive bridge comprises utilizing the lateral etch to etch the silicon substrate and the silicon layer under the conductive bridge, wherein the masking agent masks a vertical surface of a first portion of the silicon layer joined with the sensor from the lateral etch, and the first insulator layer masks a horizontal surface of the first portion of the silicon layer joined with the sensor from the lateral etch, and
wherein defining the isolation trench comprises separating the first portion of the silicon layer joined with the sensor and a second portion of the silicon layer joined with the logic component.

25. The method as in claim 24, further comprising utilizing a single photolithographic mask, during a single photolithographic masking step, for the sensor delineation, the sensor release, and the electrical isolation.

26. The method as in claim 25, wherein the compensating electronics comprise CMOS technology.

* * * * *